United States Patent Office 3,409,466

Patented Nov. 5, 1968

3,409,466

PROCESS FOR ELECTROLESSLY PLATING LEAD ON COPPER

Buford G. Slay, Jr., Bernard G. Carbajal III, and John P. Pritchard, Jr., Richardson, Tex., assignors to Texas Instruments Incorporated, Dallas, Tex., a corporation of Delaware No Drawing. Filed Jan. 6, 1965, Ser. No. 423,815
8 Claims. (Cl. 117—212)

ABSTRACT OF THE DISCLOSURE

Disclosed is a process for electrolessly plating lead on a metal such as copper which comprises subjecting the metal to a solution consisting essentially of a lead salt and thiourea dissolved in dimethylsulfoxide. The lead salt may be, for example, lead nitrate, lead chloride or lead acetate.

The present invention relates to electroless chemical plating of one metal on another, and more particularly, but not by way of limitation, relates to a process for electrolessly plating a thin film of superconductive lead on a film of copper.

In the fabrication of cryogenic devices, there are instances where it is desirable to produce a number of very small superconductive lead strips on a substrate. For example, in cryogenic associative memory arrays, it is necessary to make a large number of electrical connections between room temperature circuitry and the very small cryogenic memory arrays. It has been found that pressure contact between two lead film strips provides a superconductive joint, but in order to obtain uniform pressure on a large number of conductive strips, one set of the conductors needs to be on a flexible substrate, such as Mylar. Copper can be more adherently deposited on flexible synthetic substrates such as Mylar, can be more easily patterned, and is a better heat sink for soldering leads to the conductive strips than is lead.

The present invention is concerned with a process for electrolessly plating lead on a metal. In accordance with the present invention, a superconductive lead film may be formed by the electroless deposition of lead on most metal, particularly copper, by means of a reducing solution of a lead salt. More specifically, the solution may comprise lead nitrate or lead chloride dissolved in dimethylsulfoxide with a substantially equal quantity by weight of thiourea.

An object of the invention is to provide a process for producing electrically incoherent, patterned lead films which are adherently bonded to a substrate, and in particular to a flexible substrate formed of a synthetic material to which a lead film cannot be otherwise easily bonded.

In the process of the present invention, an electrically incoherent, thin superconductive film of lead may be formed on a substrate by first forming a thin film of metal, preferably copper, on a substrate. More specifically, the substrate may be a resilient plastic sheet or other synthetic substrate material, such as glass or the like. The cooper films may be selectively patterned using conventional photo-resist and etching techniques, or may be patterned by depositing the copper films on selectively pretreated substrates using processes known in the art.

For example, substrates are commercially available wherein a thin copper film is adherently bonded to a Mylar sheet. The copper film can then be selectively etched using conventional techniques wherein the copper film is first coated with a layer of photo-resist material. The photo-resist is then exposed through a suitable photomask and developed to leave the copper unprotected in the areas where the copper is to be removed. The substrate is then immersed in a suitable etchant which will dissolve the copper but not attack the photo-resist, nor the substrate. After the copper film has been patterned, it is then immersed in the novel lead plating solution.

In general, the lead plating solution contains lead ions and a suitable reducing agent in order to carry out the electroless plating process. Although lead salts tend to be insoluble in most solvents, most lead salts which can be dissolved in a solvent not otherwise deleterious to the materials being used may be employed within the broader aspects of this invention. More particularly, lead nitrate is dissolved in dimethylsulfoxide, and thiourea is used as both a reducing agent and complexing agent. It has been found that the dimethylsulfoxide produces significantly superior results over other solvents such as water or tetrahydrofuran both in quality of the lead deposited and in the speed of deposition. Other lead salts which may be used in accordance with the broader aspects of the invention are lead chloride and lead acetate, which are also preferably dissolved in dimethylsulfoxide.

A typical example of a plating solution in accordance with the present invention entails dissolving 35 grams of thiourea and 35 grams of lead nitrate in 175 milliliters of dimethylsulfoxide. The solution is preferably heated to about 50° C. However, neither the temperature nor the reagent concentration appears to be particularly critical parameters in the process. The use of dimethylsulfoxide as the solvent results in the rapid deposition of a lead film which is of good quality and is superconductive.

The lead films formed by this process do not tend to deposit on the substrate and therefore conform precisely to the pattern of the copper film previously formed on the substrate. The underlying copper film serves as a good heat sink when electrical leads are being soldered to the lead strips. Further, the lead films are superconductive and are more adherently bonded to the substrate.

The process of the present invention is particularly applicable to plating lead on copper and is generally applicable to plating lead on metallic and other surfaces especially prepared to receive a metallic plating by an electroless process. Accordingly, as used in the appended claims, the word "metal" is intended to include such prepared surfaces.

Although preferred embodiments of the invention have been described in detail, it is to be understood that various changes, substitutions and alterations can be made therein without departing from the spirit and scope of the invention as defined by the appended claims.

What is claimed is:

1. The process for electrolessly depositing an adherent, electrically incoherent, thin superconductive lead film on a substrate which comprises:

forming and patterning an adherent copper film on the substrate, and subjecting the copper film to a solution consisting essentially of a lead salt and thiourea dissolved in dimethylsulfoxide.

2. The process defined in claim 1 wherein the lead salt is lead nitrate, and the lead salt and thiourea are in equal parts by weight and the solution is at about 50° C.

3. The process for electrolessly plating lead on a metal which comprises subjecting the metal to a solution consisting essentially of a lead salt and thiourea dissolved in dimethylsulfoxide.

4. The process described in claim 3 wherein the lead salt is lead nitrate.

5. The process as defined in claim 3 wherein the lead salt is lead chloride.

6. The process defined in claim 3 wherein the lead salt is lead acetate.

7. The process defined in claim 3 wherein the metal is copper.

8. The process defined in claim 3 wherein the lead salt and thiourea are in equal parts by weight and the solution is at about 50° C.

References Cited

UNITED STATES PATENTS

| | | | |
|---|---|---|---|
| 1,903,860 | 4/1933 | Gockel | 204—53 |
| 2,230,602 | 2/1941 | Sullivan | 117—130 |
| 2,369,620 | 2/1945 | Sullivan et al. | 117—130 |
| 3,075,866 | 1/1963 | Baker et al. | 117—212 |

OTHER REFERENCES

Porter: A Survey of Organic Solvents for the Electrodeposition of Plutonium, AEC, DP 389, July 1959, p. 4.

Schlafer et al.: Agnew, Chem., vol. 72, p. 622 (1960).

RALPH S. KENDALL, *Primary Examiner.*